United States Patent
Hsu et al.

(10) Patent No.: US 6,548,387 B2
(45) Date of Patent: Apr. 15, 2003

(54) METHOD FOR REDUCING HOLE DEFECTS IN THE POLYSILICON LAYER

(75) Inventors: Chung-Jung Hsu, Taipei (TW); Chih-Hsien Huang, Hsin-Chu (TW)

(73) Assignee: United Microelectronics Corporation (TW)

( * ) Notice: Subject to any disclaimer, the term of this patent is extended or adjusted under 35 U.S.C. 154(b) by 67 days.

(21) Appl. No.: 09/908,702

(22) Filed: Jul. 20, 2001

(65) Prior Publication Data
US 2003/0017688 A1 Jan. 23, 2003

(51) Int. Cl.⁷ .................. H01L 21/00; H01L 21/8247
(52) U.S. Cl. .................. 438/585; 438/593; 438/952; 438/974
(58) Field of Search .................. 438/585, 952, 438/586–596, 715, 719, 906, 974

(56) References Cited

U.S. PATENT DOCUMENTS 5,312,780 A * 5/1994 Nanda et al. .......... 204/192.28

* cited by examiner

Primary Examiner—Richard Booth

(57) ABSTRACT

A method for reducing hole defects in the polysilicon layer. The method at least includes the following steps. First of all, a semiconductor substrate is provided, a polysilicon layer is formed over the semiconductor substrate. Then, no hole defects bottom anti-reflective coating process is performed, wherein the no hole defect bottom anti-reflective coating process is selected from the group consisting of dehydration baking, hydrophobic solvent treatment, and steady baking. Finally, a bottom anti-reflective coating is formed over the polysilicon layer.

22 Claims, 4 Drawing Sheets

| slot | condition | defect | ADI |
|---|---|---|---|
| 1 | BARC 1350A (standard) | 1587 | white specks |
| 2 | Dehydration bake | 171 | normal |
| 3 | Dehydration bake | 35 | |
| 4 | hydrophobic solvent treament | 35 | normal |
| 5 | hydrophobic solvent treament | 29 | |
| 6 | steady bake | 134 | normal |
| 7 | steady bake | 46 | |
| 8 | Dehydration bake + hydrophobic solvent treatment | 26 | normal |
| 9 | Dehydration bake + hydrophobic solvent treatment | 11 | |
| 10 | hydrophobic solvent + steady bake | 22 | normal |
| 11 | hydrophobic solvent + steady bake | 20 | |
| 12 | Dehydration bake + steady bake | 59 | normal |
| 13 | Dehydration bake + steady bake | 3 | |
| 14 | Dehydration bake + hydrophobic solvent treatment + steady bake | 11 | normal |
| 15 | Dehydration bake + hydrophobic solvent treatment + steady bake | 12 | |

FIG.2D

METHOD FOR REDUCING HOLE DEFECTS IN THE POLYSILICON LAYER

BACKGROUND OF THE INVENTION

1. Field of the Invention

The present invention generally relates to a method for forming a semiconductor device, and more particularly to a method for reducing hole defects in the polysilicon layer.

2. Description of the Prior Art

Flash memory is the most potential memory in the semiconductor industry. Flash memory has been broadly applied to repeatedly access data and to remain assessable during power break down, such as the film of digital camera or the basic input-output system of a motherboard. Because flash memory has the advantages of electrically erasable and programmable mechanisms, it can simultaneously proceed the erase and the program mechanisms to all flash memory cells in the whole memory array. Accordingly, how to advance the performance and reduce the cost of the flash memory became an important subject.

Anti-reflective coatings have been used in the fabrication of small dimension integrated circuits (ICs) to provide better control over the photolithographic process. In particular, organic BARCs (bottom anti-reflective coatings) have been used during the contact hole masking step to reduce the reflections from the underlying topography substrate and thereby provide better control over the width of the photoresist mask openings which are used to form contact holes of a desired width.

Referring to FIG. 1A, firstly, a semiconductor substrate 100 is provided, and a polysilicon layer 102 is formed over a semiconductor substrate 100. Then, a silicon oxide layer 104 is formed over the polysilicon layer 102. A bottom anti-reflective coating (BARC) layer 106 is formed on the silicon oxide layer 104 by using spin-coating method, wherein the bottom anti-reflective coating (BARC) layer 106 has a micro bubbles 107 therein. A photoresist layer 108 is formed on the bottom anti-reflective coating (BARC) layer 106 by using spin-coting method. The photoresist layer 108 has an opening by using conventional lithographic technology.

Referring to FIG. 1B, the bottom anti-reflective coating (BARC) layer 106, the silicon oxide layer 104, and the polysilicon layer 102 are etched by using the photoresist layer 108 as a mask. Because the bottom anti-reflective coating (BARC) layer 106 has micro bubbles 107 therein, the active area interface between the substrate 100 and the polysilicon layer 102 has hole defects. Then, the photoresist layer 108 is removed.

For the forgoing reasons, a necessary method for reducing hole defects in the polysilicon layer is required. The solvent and bake treatment can reduce hole defects in the polysilicon layer.

SUMMARY OF THE INVENTION

In accordance with the present invention, a method for reducing hole defects in the polysilicon layer that substantially can reduce hole defects in the polysilicon layer in conventional process.

One object of the present invention is to provide a method for reducing hole defects in the polysilicon layer to improve the hole defects issue.

In order to achieve the above object, the present invention provides a method for reducing hole defects in the polysilicon layer. The method at least includes the following steps. First of all, a semiconductor substrate is provided, a polysilicon layer is formed over the semiconductor substrate. Then, no hole defects bottom anti-reflective coating process is performed, wherein the no hole defects bottom anti-reflective coating process is selected from the group consisting of dehydration baking, hydrophobic solvent treatment, and steady baking. Finally, a bottom anti-reflective coating is formed over the polysilicon layer.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein:

FIG. 2D is an experimental data test run chart of a method for reducing hole defects in the polysilicon layer.

DESCRIPTION OF THE PREFERRED EMBODIMENT

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sectional, two-dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

Figure 1A:
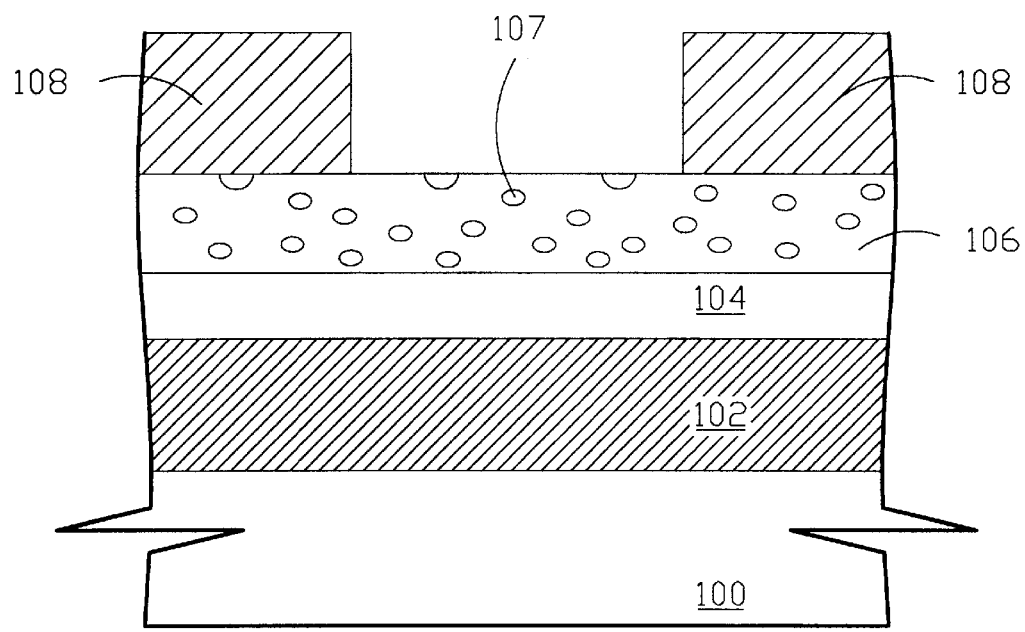
FIGS. 1A to 1B show a method for forming a bottom anti-reflective coating (BARC) on the polysilicon layer in the prior art.
Figure 1B:
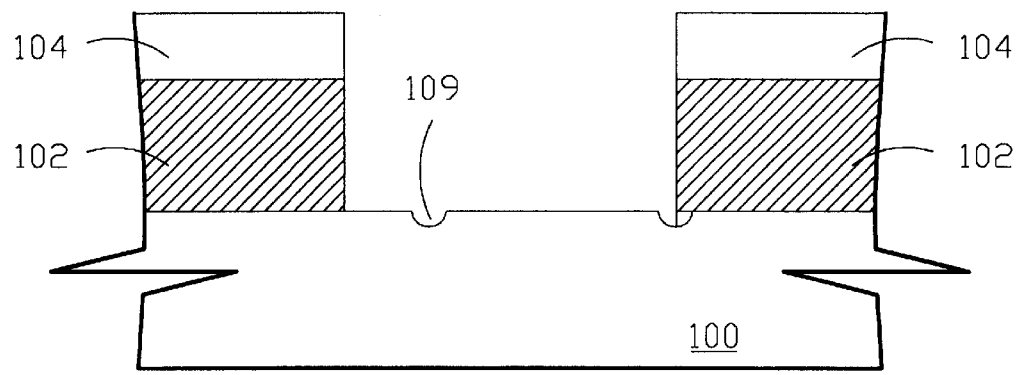
Figure 2A:
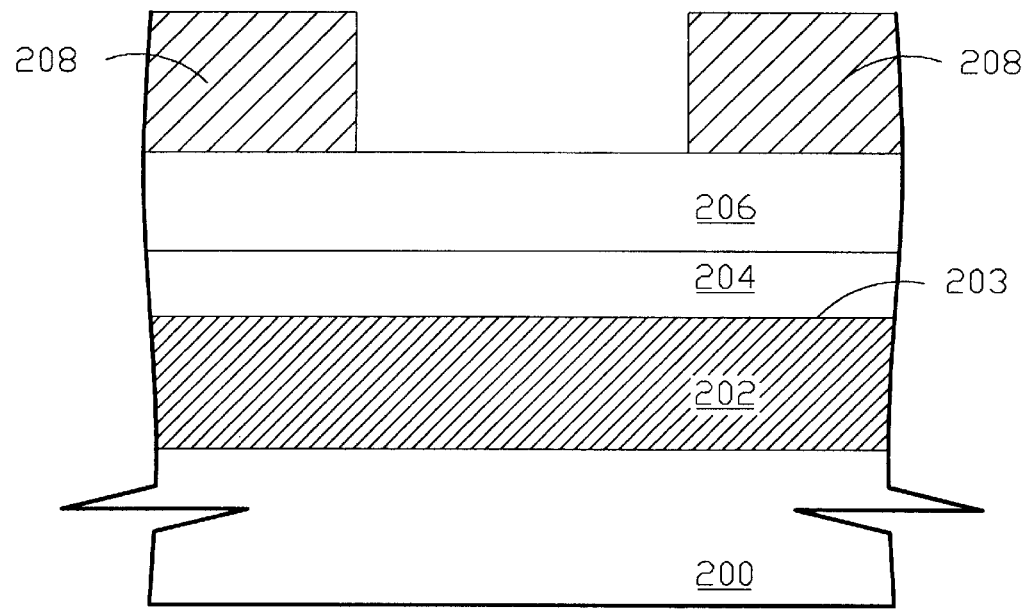
FIGS. 2A to 2B are cross-sectional views of a method for reducing hole defects in the polysilicon layer in accordance with one preferred embodiment of the present invention.
Figure 2B:
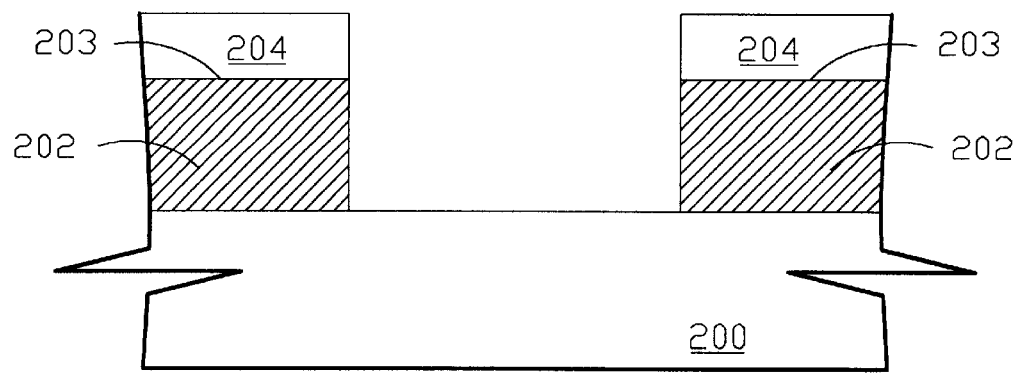

FIG. 2A to FIG. 2B are cross-sectional views of a method for reducing hole defects in the polysilicon layer in accordance with one preferred embodiment of the present invention.

Figure 2C:
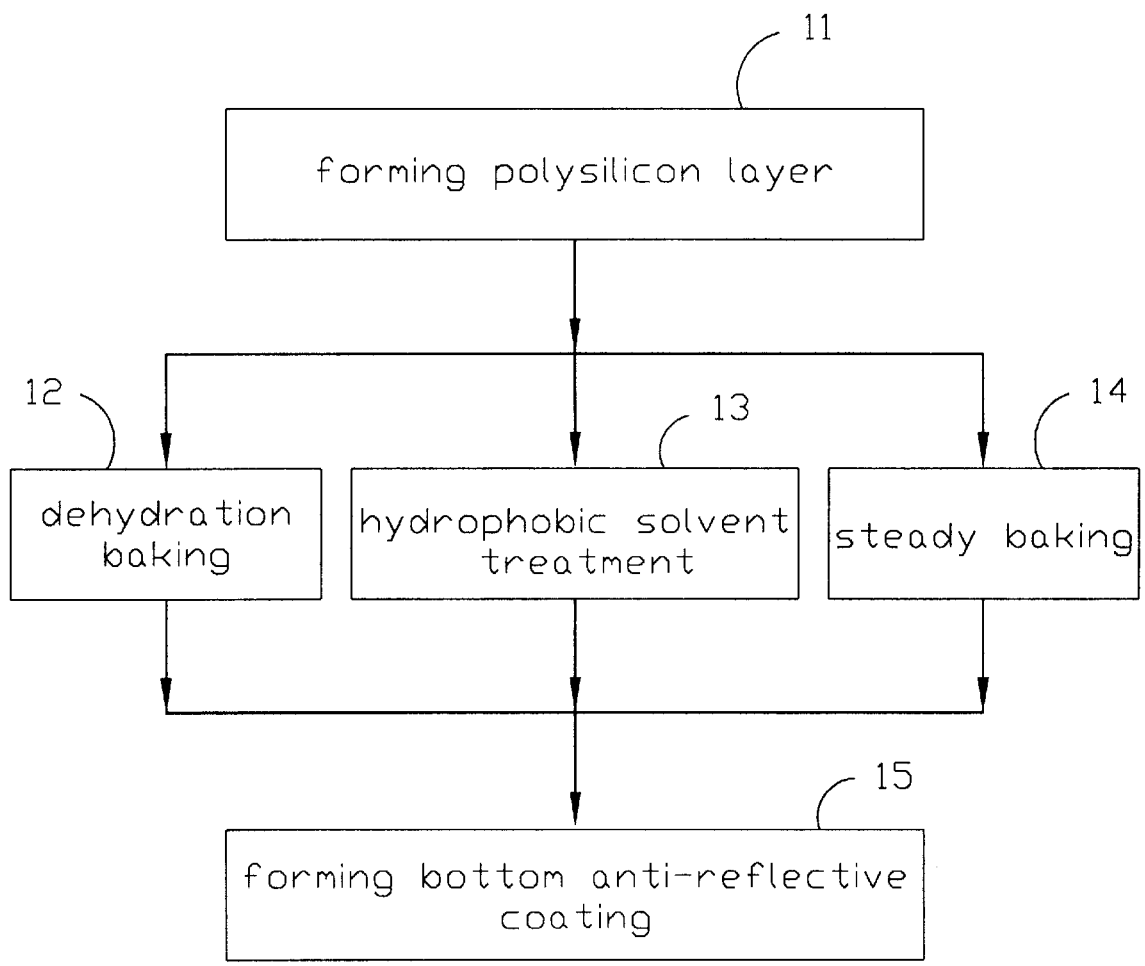
FIG. 2C is a flow chart of a method for reducing hole defects in the polysilicon layer.

FIG. 2C is a flow chart of a method for reducing hole defects in the polysilicon layer;

FIG. 2D is an experimental data test run chart of a method for reducing hole defects in the polysilicon layer.

Referring to FIG. 2A, firstly, a semiconductor wafer 200 is provided, wherein the semiconductor wafer 200 comprises silicon. Then, a polysilicon layer 202 is formed over a semiconductor wafer 200. The polysilicon layer 202 has a thickness of about 2500 angstroms. Then, a silicon oxide layer 204 is formed over the polysilicon layer 202. The silicon oxide layer 204 has a thickness of about 1200 angstroms. Next, a bottom anti-reflective coating (BARC) layer 206 is formed on the silicon oxide layer 204 by using spin-coating method. The bottom anti-reflective coating (BARC) layer 206 has a thickness of about 1350 angstroms. A photoresist layer 208 is formed on the bottom anti-reflective coating (BARC) layer 206 by using spin-coating method. The photoresist layer 208 has an opening by using conventional lithographic technology. As key steps of the process (a), (b), and (c) have accomplished when a bottom anti-reflective coating (BARC) layer 206 is formed on the silicon oxide layer 204 by using spin-coating method. Then, this invention performing a dehydrating treatment, wherein the dehydrating treatment is selected from the group consisting of process (a) dehydration baking, process (b) hydrophobic solvent treatment, and process (c) steady baking; i.e., process (a), process (b), process (c), process (a)+(b), process (a)+(c), process (b)+(c), or process (a)+(b)+(c), wherein the process (a) is dehydration baking, process (b) is treatment the polysilicon layer with a hydrophobic solvent, and process (c) is steady baking said polysilicon layer to rise temperature step by step. The steady baking the polysilicon layer at least four times, wherein the duration of the steady baking is about 60 seconds and each baking temperature is higher than the former baking temperature.

The process (a): Dehydration baking is achieved by heating the wafer 200 at about 205° C. for 60 seconds to evaporate the wafer 200 from the surface. The dehydration baking can release free energy on the wafer 200 from the surface; i.e., physical release. However, to sum up the two main functions: the first releases moisture. The second is like the annealing function to release accumulated energy on the entire wafer; i.e., rearrange lattices of the wafer from the surface, and the process(a)is treated by a heating procedure similar to annealing.

The process (b): The wafer 200 can avoid micro bubbles by using hydrophobic solvent pretreatment. The solvent name of an article is OK82. The solvent is a mixture of PGME [$CH_3OCH_2CH(OH)CH_3$] and PGMEA [$CH3CH(OCOCH3)CH3OCH3$]. The ratio of PGME [$CH_3OCH_2CH(OH)CH_3$] to PGMEA [$CH3CH(OCOCH3)CH3OCH3$] is 8:2. The solvent pretreatment can release free energy on the wafer 200 from the surface; i.e., chemical release. However, to sum up the process (b) main functions can reduce contact angle. Because bubbles occur when contact with the substrate; the photoresist is hydrophobic, and the process (b) can reduce contact angle and make adhesion better between the substrate and the photoresist. Both (a) and (b) can avoid micro bubbles being trapped on the topography film.

The process (c): The steady baking is achieved by gradually gentle heating the wafer 200 to release micro bubbles on the wafer 200 from the surface. The steady baking can avoid the wafer 200 contact with high temperature suddenly and generate micro bubbles. The steady baking comprises four steps: (1) Heating the wafer 200 at about 90° C. for 60 seconds to evaporate the wafer 200 from the surface and the bubbles in the phooresist. (2) Heating the wafer 200 at about 110° C. for 60 seconds to evaporate the wafer 200 from the surface and the bubbles in the phooresist. (3) Heating the wafer 200 at about 175° C. for 60 seconds to evaporate the wafer 200 from the surface and the bubbles in the phooresist. (4) Heating the wafer 200 at about 205° C. for 60 seconds to evaporate the wafer 200 from the surface and the bubbles in the phooresist. The four steps are heating the wafer 200 gradually.

Referring to FIG. 2B, the bottom anti-reflective coating (BARC) layer 206, the silicon oxide layer 204, and the polysilicon layer 202 are etched by using the photoresist layer 208 as a mask. The bottom anti-reflective coating (BARC) layer 206 is formed before by using solvent and bake pretreatment to reduce hole defects in the polysilicon layer 202. The active area interface between the substrate 200 and the polysilicon layer 202 has no hole defects. Then, the photoresist layer 208 is removed.

Referring to FIG. 2C, this figure is a flow chart in this invention. The step 11 shows the polysilicon layer is formed. Then, perform separately the step 12, the step 13 and the step 14 or combine the step 12, the step 13, and the step 14. The step 12 shows dehydration baking. The step 13 shows treatment of the polysilicon layer with a hydrophobic solvent. The step 14 shows steady baking. Finally, perform the step 15. The step 15 shows the bottom anti-reflective coating (BARC) layer is formed.

Referring to FIG. 2D, experimental data test run chart is shown, in which the slot 1 is a bottom anti-reflective coating having a thickness of about 1350 angstroms in standard conduction, wherein the polysilicon layer has 1587 defects and white specks phenomenon after develop inspection (ADI). The slot 2 adds the dehydration baking step of process (a), wherein the polysilicon layer has 171 defects and normal phenomenon after develop inspection. The slot 3 adds the dehydration baking step of process (a), wherein the polysilicon layer has 35 defects and normal phenomenon after develop inspection. The slot 4 adds the hydrophobic solvent treatment step of process (b), wherein the polysilicon layer has 35 defects and normal phenomenon after develop inspection. The slot 5 adds the hydrophobic solvent treatment step of process (b), wherein the polysilicon layer has 29 defects and normal phenomenon after develop inspection. The slot 6 adds the steady baking step of process (c), wherein the polysilicon layer has 134 defects and normal phenomenon after develop inspection. The slot 7 adds the steady baking step of process (c), wherein the polysilicon layer has 46 defects and normal phenomenon after develop inspection. The slot 8 adds the dehydration baking step of process (a) and the hydrophobic solvent treatment step of process (b), wherein the polysilicon layer has 26 defects and normal phenomenon after develop inspection. The slot 9 add the dehydration baking step of process (a) and the hydrophobic solvent treatment step of process (b), wherein the polysilicon layer has 11 defects and normal phenomenon after develop inspection. The slot 10 adds the hydrophobic solvent treatment step of process (b) and the steady baking step of process (c), wherein the polysilicon layer has 22 defects and normal phenomenon after develop inspection. The slot 11 adds the hydrophobic solvent treatment step of process (b) and the steady baking step of process (c), wherein the polysilicon layer has 20 defects and normal phenomenon after develop inspection. The slot 12 adds the dehydration baking step of process (a) and the steady baking step of process (c), wherein the polysilicon layer has 59 defects and normal phenomenon after develop inspection. The slot 13 adds the dehydration baking step of process (a) and the steady baking step of process (c), wherein the polysilicon layer has 3 defects and normal phenomenon after develop inspection. The slot 14 adds the dehydration baking step of process (a), the hydrophobic solvent treatment step of process (b), and the steady baking step of process (c), wherein the polysilicon layer has 11 defects and normal phenomenon after develop inspection. The slot 14 adds the dehydration baking step of process (a), the hydrophobic solvent treatment step of process (b), and the steady baking step of process (c), wherein the polysilicon layer has 15 defects and normal phenomenon after develop inspection. According the experiment data shows, adding the process (a), the process (b), and the process (c) steps can reduce a order hole defects in the polysilicon layer and normal phenomenon after develop inspection. Therefore, it is the most important critical point that combination of the process (a), the process (b), and the process (c) steps only overtake ten hole defects in the polysilicon layer for showing in the experiment data.

The method for reducing hole defects in the polysilicon layer using the above explained method, has the following advantages:

The present invention is to provide a method for reducing hole defects in the polysilicon layer to improve hole defects issue.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for reducing hole defects in the polysilicon layer, said method comprising the steps of:
   providing a semiconductor substrate;
   forming a polysilicon layer over said semiconductor substrate;
   dehydration baking said polysilicon layer; and
   forming a bottom anti-reflective coating over said polysilicon layer.

2. The method according to claim 1, wherein said dehydration baking is at temperature of about 205° C. for about 60 seconds.

3. The method according to claim 1, further comprising a step of treating said polysilicon layer with a hydrophobic solvent after said step of dehydration baking.

4. The method according to claim 2, wherein said hydrophobic solvent is a mixture of PGME [$CH_3OCH_2CH(OH)CH_3$] and PGMEA [$CH_3CH(OCOCH_3)CH_3OCH_3$].

5. The method according to claim 4, wherein the ratio of said PGME [$CH_3OCH_2CH(OH)CH_3$] to PGMEA [CH3CH(OCOCH3)CH3OCH3] is 8:2.

6. The method according to claim 2, further comprising a step of steady baking said polysilicon layer to rise temperature step by step after said step of treating said polysilicon layer with a hydrophobic solvent.

7. The method according to claim 1, further comprising a step of steady baking said polysilicon layer to rise temperature step by step after said step of treating said polysilicon layer with a hydrophobic solvent.

8. A method for reducing hole defects in the polysilicon layer, said method comprising the steps of:
   providing a semiconductor substrate;
   forming a polysilicon layer over said semiconductor substrate;
   treating said polysilicon layer with a hydrophobic solvent; and
   forming a bottom anti-reflective coating over said polysilicon layer.

9. The method according to claim 8, wherein said hydrophobic solvent is a mixture of PGME [$CH_3OCH_2CH(OH)CH_3$] and PGMEA [$CH_3CH(OCOCH_3)CH_3OCH_3$].

10. The method according to claim 9, wherein the ratio of said PGME [$CH_3OCH_2CH(OH)CH_3$] to PGMEA [CH3CH(OCOCH3)CH3OCH3] is 8:2.

11. The method according to claim 8, further comprising a step of steady baking said polysilicon layer to rise temperature step by step after said step of treating said polysilicon layer with a hydrophobic solvent.

12. A method for reducing hole defects in the polysilicon layer, said method comprising the steps of:
    providing a semiconductor substrate;
    forming a polysilicon layer over said semiconductor substrate;
    steady baking said polysilicon layer to rise temperature step by step; and
    forming a bottom anti-reflective coating over said polysilicon layer.

13. The method according to claim 12, wherein said steady baking is at first temperature of about 90° C. for about 60 seconds.

14. The method according to claim 13, wherein said steady baking is at second temperature of about 110° C. for about 60 seconds.

15. The method according to claim 14, wherein said steady baking is at third temperature of about 175° C. for about 60 seconds.

16. The method according to claim 15, wherein said steady baking is at four temperature of about 205° C. for about 60 seconds.

17. A method for reducing hole defects in the polysilicon layer, said method comprising the steps of:
    providing a semiconductor substrate;
    forming a polysilicon layer over said semiconductor substrate;
    performing a dehydrating treatment, wherein said dehydrating treatment is selected from the group consisting of dehydration baking, a mixture of PGME [$CH_3OCH_2CH(OH)CH_3$] and PGMEA [$CH_3CH(OCOCH_3)CH_3OCH_3$] treatment, and steady baking; and
    forming a bottom anti-reflective coating over said polysilicon layer.

18. The method according to claim 17, wherein said dehydration baking is at temperature of about 205° C. for about 60 seconds.

19. The method according to claim 17, wherein said steady baking is at first temperature of about 90° C. for about 60 seconds.

20. The method according to claim 19, wherein said steady baking is at second temperature of about 110° C. for about 60 seconds.

21. The method according to claim 20, wherein said steady baking is at third temperature of about 175° C. for about 60 seconds.

22. The method according to claim 21 wherein said steady baking is at fourth temperature of about 205° C. for about 60 seconds.

* * * * *